(12) United States Patent
Kositza et al.

(10) Patent No.: US 10,516,343 B2
(45) Date of Patent: Dec. 24, 2019

(54) POWER SEMICONDUCTOR PACKAGE AND APPLICATIONS

(71) Applicant: Infineon Technologies AG, Neubiberg (DE)

(72) Inventors: Juergen Kositza, Munich (DE); Herbert Gietler, Villach (AT); Harald Huber, Glanegg (AT); Michael Lenz, Zorneding (DE)

(73) Assignee: Infineon Technologies AG, Neubiberg (DE)

( * ) Notice: Subject to any disclaimer, the term of this patent is extended or adjusted under 35 U.S.C. 154(b) by 46 days.

(21) Appl. No.: 15/446,568

(22) Filed: Mar. 1, 2017

(65) Prior Publication Data

US 2017/0257037 A1    Sep. 7, 2017

(30) Foreign Application Priority Data

Mar. 2, 2016 (DE) .................... 10 2016 103 714

(51) Int. Cl.
| | | |
|---|---|---|
| *H02M 7/217* | (2006.01) | |
| *H01L 23/48* | (2006.01) | |
| *H01L 25/00* | (2006.01) | |
| *H02M 1/084* | (2006.01) | |
| *H02M 7/06* | (2006.01) | |
| *H02M 7/00* | (2006.01) | |
| *H02M 7/219* | (2006.01) | |
| *H01L 25/07* | (2006.01) | |

(52) U.S. Cl.
CPC ............ *H02M 7/217* (2013.01); *H01L 25/00* (2013.01); *H02M 1/084* (2013.01); *H02M 7/003* (2013.01); *H02M 7/06* (2013.01); *H02M 7/219* (2013.01); *H01L 23/48* (2013.01); *H01L 25/074* (2013.01)

(58) Field of Classification Search
CPC ........ H02M 1/084; H02M 7/003; H02M 7/04; H02M 7/06; H02M 7/217; H02M 7/219; H01L 25/00
See application file for complete search history.

(56) References Cited

U.S. PATENT DOCUMENTS

| | | | |
|---|---|---|---|
| 6,060,795 | A | 5/2000 | Azotea et al. |
| 9,024,423 | B2 | 5/2015 | Muto et al. |
| 2012/0068320 | A1 | 3/2012 | Yang et al. |
| 2012/0193772 | A1 | 8/2012 | Jiang |
| 2013/0075893 | A1 | 3/2013 | Herbsommer et al. |
| 2014/0002049 | A1* | 1/2014 | Schrom .................. H02M 1/08 323/311 |
| 2014/0306332 | A1 | 10/2014 | Denison et al. |
| 2017/0164497 | A1* | 6/2017 | Wagoner ................ H05K 7/023 |

FOREIGN PATENT DOCUMENTS

| | | |
|---|---|---|
| CN | 101894834 | 11/2010 |
| JP | H07-337020 | 12/1995 |
| JP | 2010-283236 | 12/2010 |
| WO | 2016/013987 | 1/2016 |

* cited by examiner

*Primary Examiner* — Gary L Laxton
*Assistant Examiner* — Ivan Laboy
(74) *Attorney, Agent, or Firm* — Dicke, Billig & Czaja, PLLC

(57) ABSTRACT

A power semiconductor package includes a reference voltage terminal, a supply voltage terminal, a phase terminal, a first power transistor and a second power transistor. The first power transistor and the second power transistor are connected in series and form a low side switch and a high side switch of a half bridge circuit.

19 Claims, 5 Drawing Sheets

POWER SEMICONDUCTOR PACKAGE AND APPLICATIONS

CROSS-REFERENCE TO RELATED APPLICATION

This Utility Patent Application claims priority to German Patent Application No. 10 2016 103 714.1, filed Mar. 2, 2016; which is incorporated herein by reference.

TECHNICAL FIELD

The disclosure relates, in general, to semiconductor devices. More particular, the disclosure relates to power semiconductor packages and applications thereof.

BACKGROUND

Power semiconductor packages may be applied in various technical fields and applications such as e.g. automotive electronics. During an operation of automotive electronic components losses may occur which result in an undesired increase of fuel consumption and emissions of the vehicle. Power semiconductors and their packages constantly have to be improved. In particular, it may be desirable to improve an efficiency of automotive electronic components in order to reduce fuel consumption and emissions.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference signs may designate corresponding similar parts.

DETAILED DESCRIPTION

Figure 1:
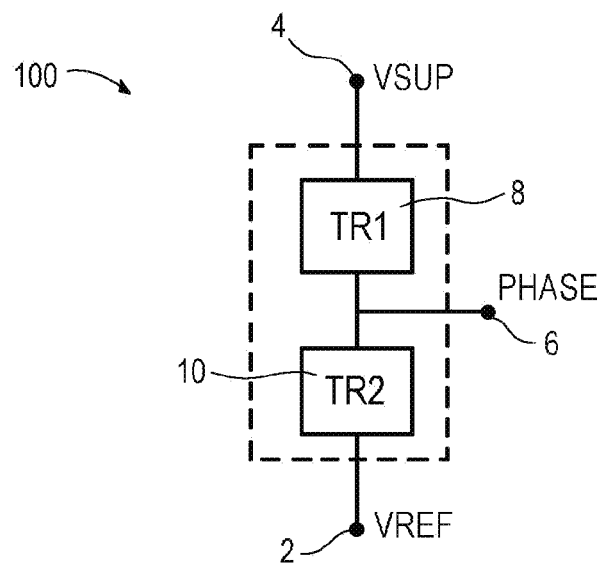
FIG. 1 schematically illustrates a power semiconductor package in accordance with the disclosure.

In the following detailed description, reference is made to the accompanying drawings, in which are shown by way of illustration specific aspects in which the disclosure may be practiced. In this regard, directional terminology, such as "top", "bottom", "front", "back", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense, and the concept of the present disclosure is defined by the appended claims.

As employed in this specification, the terms "connected", "coupled", "electrically connected" and/or "electrically coupled" may not necessarily mean that elements must be directly connected or coupled together. Intervening elements may be provided between the "connected", "coupled", "electrically connected" or "electrically coupled" elements.

Further, the word "over" used with regard to e.g. a material layer formed or located "over" a surface of an object may be used herein to mean that the material layer may be located (e.g. formed, deposited, etc.) "directly on", e.g. in direct contact with, the implied surface. The word "over" used with regard to e.g. a material layer formed or located "over" a surface may also be used herein to mean that the material layer may be located (e.g. formed, deposited, etc.) "indirectly on" the implied surface with e.g. one or more additional layers being arranged between the implied surface and the material layer.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures. In addition, the features of the various exemplary aspects described herein may be combined with each other, unless specifically noted otherwise.

The devices described herein may include one or more semiconductor chips. In general, the semiconductor chips may include integrated circuits, passive electronic components, active electronic components, etc. The integrated circuits may be designed as logic integrated circuits, analog integrated circuits, mixed signal integrated circuits, power integrated circuits, etc. The semiconductor chips need not be manufactured from a specific semiconductor material and may contain inorganic and/or organic materials that are not semiconductors, such as, for example, insulators, plastics, metals, etc. In one example, the semiconductor chips may be manufactured from an elemental semiconductor material, for example Si, etc. In a further example, the semiconductor chips may be manufactured from a compound semiconductor material, for example GaN, SiC, SiGe, GaAs, etc.

In an example, the semiconductor chips may include a power semiconductor. In general, power semiconductor chips may be configured as diodes, power MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), super junction devices, power bipolar transistors, etc. In a first case, the power semiconductor chips may have a vertical structure, i.e. the semiconductor chips may be fabricated such that electrical currents may substantially flow in a direction perpendicular to the main surfaces of the semiconductor chips. For example, the gate electrode and the source electrode of a power MOSFET may be arranged over one main surface while the drain electrode of the power MOSFET may be arranged over the other main surface. In a second case, the power semiconductor chips may have a lateral structure, i.e. the semiconductor chips may be fabricated such that electrical currents may substantially flow in a direction parallel to a main surface of the semiconductor chips. For example, the gate electrode, the source electrode and the drain electrode of a power MOSFET may be arranged over one main surface of the power MOSFET.

In a further example, the semiconductor chips may be configured to control (or drive) electronic components of a device in accordance with the disclosure. For example, such control (or drive) semiconductor chips may be configured to control the integrated circuits of one or more power semiconductor chips. A control circuit may be configured to drive one or more electronic components of the device, such as e.g. a high-power transistor. Here, the control circuit and the high-power transistor may be monolithically integrated in one semiconductor chip. The driven components may be voltage driven or current driven. In one case, driving a component including a gate electrode may be performed by a gate driver circuit. The driving process may include applying different voltages to the gate electrode, for example in form of turn-on and turn-off switching wave forms.

The devices described herein may include one or more electrical terminals, such as e.g. a supply voltage terminal, a reference voltage terminal, a phase terminal. An electrical terminal of a semiconductor package may particularly allow electrical contact to be made with internal electronic structures and electronic components (e.g. semiconductor chips) included and arranged in the semiconductor package from outside of the semiconductor package. Such terminals may be particularly located at a periphery of the semiconductor package and thus represent external terminals of the semiconductor package. The terminals may thus have exposed parts and therefore may be accessible from outside the semiconductor package. In this regard, the contact terminals may be distinguished from electrical terminals that may be a part of an internal structure of the semiconductor package. In one example, a terminal (e.g. a power supply terminal or a phase terminal) may include or may correspond to a pin or a lead. In a further example, a terminal (e.g. a reference terminal) may include or may correspond to a base plate (e.g. a base plate of a press-fit package). The terminals may be made of a metal and/or a metal alloy, in particular copper and/or copper alloy. A semiconductor package may be classified based on the number of its (external) terminals. For example, a 3-terminal semiconductor package may correspond to a semiconductor package having a number of exactly three terminals that may be accessible from outside the semiconductor package.

FIG. 1 schematically illustrates a power semiconductor package 100 in accordance with the disclosure. The power semiconductor package 100 is illustrated in a general manner in order to qualitatively specify an aspect of the disclosure. The power semiconductor package 100 may include further components which are not illustrated for the sake of simplicity. For example, the power semiconductor package 100 may further include one or more components of other devices in accordance with the disclosure.

The power semiconductor package 100 may include a reference voltage terminal 2 (see VREF), a supply voltage terminal 4 (see VSUP) and a phase terminal 6 (see PHASE). In particular, each of the terminals 2, 4, 6 may correspond to an external terminal of the power semiconductor package 100 accessible from outside the power semiconductor package 100. In FIG. 1, a periphery of the power semiconductor package 100 is indicated by a dashed line. As such, the power semiconductor package 100 may particularly correspond to a 3-terminal package. The power semiconductor package 100 may further include a first power transistor 8 and a second power transistor 10. The first power transistor 8 and the second power transistor 10 may be connected in series and may form a low side switch and a high side switch of a half bridge circuit.

As will be described later on, the power semiconductor package 100 may be configured to operate as a branch of a multiphase rectifier in one example. During an operation of such rectifier, a voltage drop may occur at a branch of the rectifier. For the case of the rectifier branch being implemented using diodes, the value of such voltage drop may be about 1V. In contrast to this, the voltage drop at a branch may be reduced to a value of about 0.2V when the branch is implemented based on a power semiconductor component in accordance with the disclosure. A specific example for a rectifier including power semiconductor components in accordance with the disclosure is discussed in connection with FIG. 8.

Figure 2:
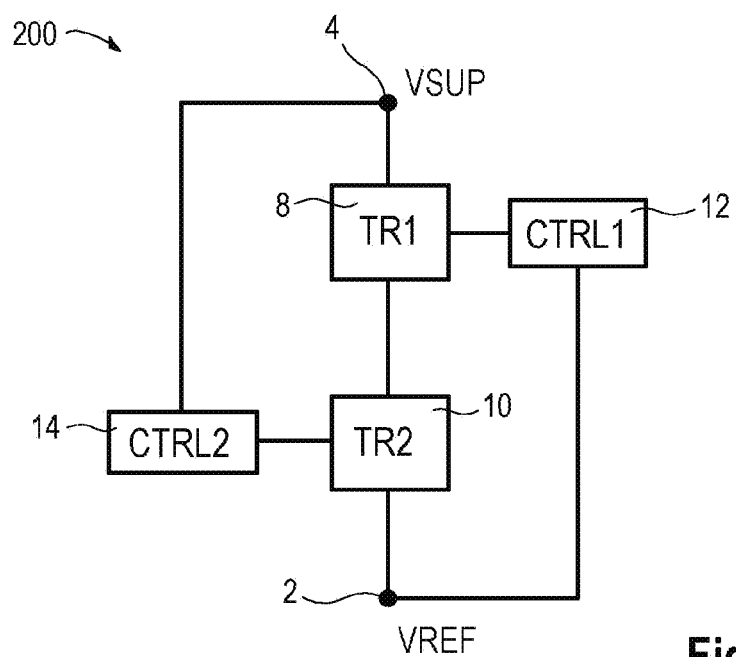
FIG. 2 schematically illustrates a circuit in accordance with the disclosure.

FIG. 2 schematically illustrates a circuit 200 in accordance with the disclosure. The circuit 200 is illustrated in a general manner in order to qualitatively specify an aspect of the disclosure. The circuit 200 may include further components which are not illustrated for the sake of simplicity. For example, the circuit 200 may further include one or more components of other devices in accordance with the disclosure.

The circuit 200 may include a reference voltage terminal 2 (see VREF) and a supply voltage terminal 4 (see VSUP). The circuit 200 may further include a first power transistor 8 and a second power transistor 10. The first power transistor 8 and the second power transistor 10 may be connected in series and may form a low side switch and a high side switch of a half bridge circuit. The circuit 200 may further include a first controller 12 configured to control the first power transistor 8, wherein the first controller 12 may be interconnected between the first power transistor 8 and the reference voltage terminal 2. In addition, the circuit 200 may include a second controller 14 configured to control the second power transistor 10, wherein the second controller 14 may be interconnected between the second power transistor 10 and the supply voltage terminal 4.

In the example of FIG. 2, each of the first controller 12 and the second controller 14 is connected in the circuit 200 such that each of the controllers 12 and 14 may be configured to be power supplied based on a potential difference between a reference voltage applied to the reference voltage terminal 2 and a supply voltage applied to the supply voltage terminal 4. That is, the potential difference may be exploited to supply the controllers 12 and 14. A power supply of the first controller 12 and the second controller 14 may thus be independent of a package internal power source. A power semiconductor package including the circuit 200 therefore may not be required to include an additional power source to supply the first controller 12 and the second controller 14.

Figure 3:
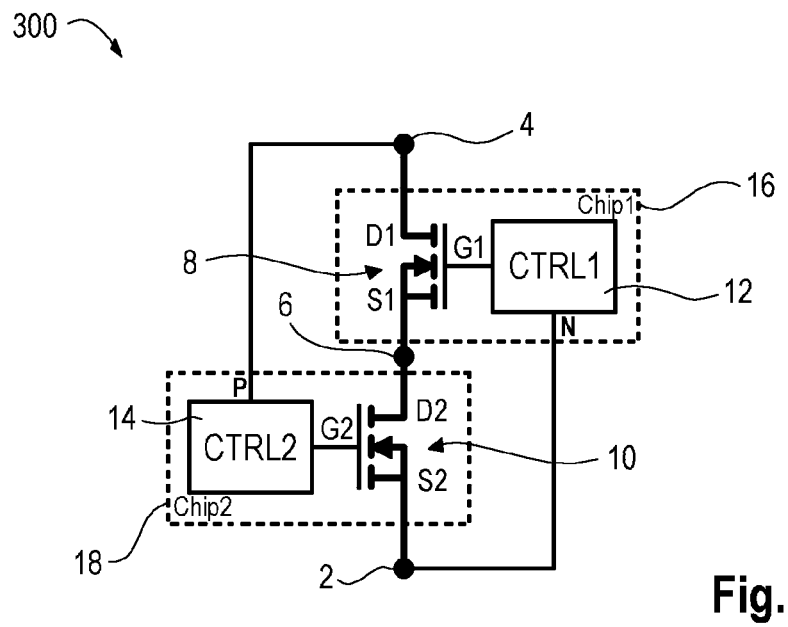
FIG. 3 schematically illustrates a circuit in accordance with the disclosure.

FIG. 3 schematically illustrates a circuit 300 in accordance with the disclosure. The circuit 300 may be seen as a more detailed implementation of the circuit 200 such that details of the circuit 300 described below may be likewise applied to the circuit 200. The circuit 300 may be included in a power semiconductor package in accordance with the disclosure. Such power semiconductor package may e.g. be configured to operate as a branch of a multiphase rectifier.

The circuit 300 may include a reference voltage terminal 2, a supply voltage terminal 4 and a phase terminal 6. Further, the circuit 300 may include a first power transistor 8, a second power transistor 10, a first controller 12 and a second controller 14. The first power transistor 8 and the first controller 12 may form a first semiconductor chip 16, while the second power transistor 10 and the second controller 14 may form a second semiconductor chip 18. In particular, the first power transistor 8 and the first controller 12 may be monolithically integrated in the first semiconductor chip 16, and the second power transistor 10 and the second controller 14 may be monolithically integrated in the second semiconductor chip 18.

In the example of FIG. 3, the supply voltage terminal 4 may be electrically coupled to a power supply (not illustrated), in particular to a terminal of a DC power supply such as e.g. a battery. In this regard, the reference voltage terminal 2 may be electrically coupled to a further terminal of the DC power supply. In particular, the reference voltage terminal may be grounded. The phase terminal 6 may be electrically coupled to an electrical generator (not illustrated).

Each of the first power transistor 8 and the second power transistor 10 may correspond to a power MOSFET. In this regard, each of the first power transistor 8 and the second power transistor 10 may include a gate electrode (see G1, G2), a source electrode (see S1, S2) and a drain electrode (see D1, D2). The drain electrode D1 of the first power transistor 8 may be electrically coupled to the supply voltage terminal 4, the gate electrode G1 of the first power transistor 8 may be electrically coupled to first controller 12, and the source electrode S1 of the first power transistor 8 may be electrically coupled to the drain electrode D2 of the second power transistor 10. Furthermore, the gate electrode G2 of the second power transistor 10 may be electrically coupled to the second controller 14, and the source electrode S2 of the second power transistor 10 may be electrically coupled to the reference voltage terminal 2. Accordingly, the first power transistor 8 and the second power transistor 14 may be connected in series, wherein the phase terminal 6 may be interconnected between the source electrode S1 of the first power transistor 8 and the drain electrode D2 of the second power transistor 10.

The first controller 12 may be interconnected between the gate electrode G1 of the first power transistor 8 and the reference voltage terminal 2. In a similar fashion, the second controller 14 may be interconnected between the gate electrode G2 of the second power transistor 10 and the supply voltage terminal 4. Due to their arrangement in the circuit 300, each of the controllers 12 and 14 may be configured to be power supplied based on a potential difference between a supply voltage applied to the supply voltage terminal 4 and a reference voltage applied to the reference voltage terminal 2. Therefore, an additional power source for providing a power supply of the first controller 12 and the second controller 14 may be omitted.

The first power transistor 8 and the second power transistor 10 may be configured to operate as a low side switch and a high side switch of a half bridge circuit arranged between the reference voltage terminal 2 and the supply voltage terminal 4. In this regard, the first controller 12 may be configured to operate as a gate driver and control the gate electrode G1 of the first power transistor 8. Similarly, the second controller 14 may be configured to operate as a gate driver and control the gate electrode G2 of the second power transistor 10.

Figure 4:
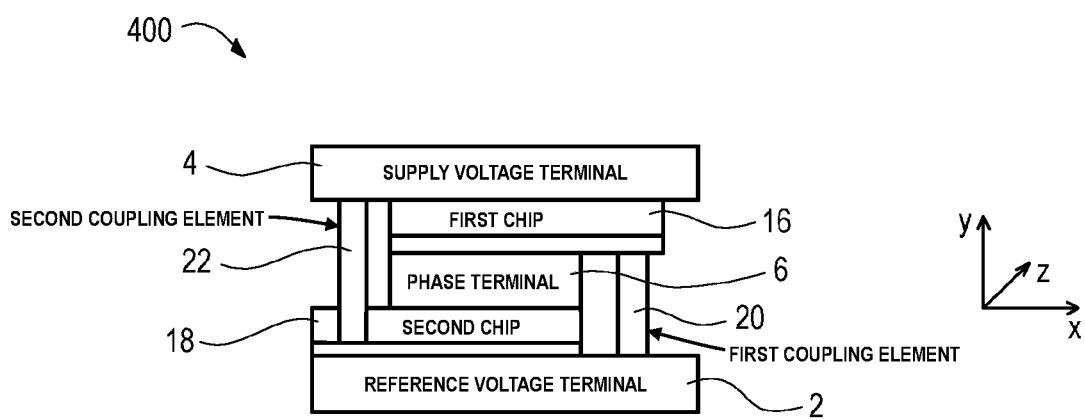
FIG. 4 schematically illustrates a cross-sectional side view of a device in accordance with the disclosure.

FIG. 4 schematically illustrates a cross-sectional side view of a device 400 in accordance with the disclosure. The device 400 may be configured to operate according to the circuit 300 of FIG. 3. The device 400 may include further components which are not illustrated for the sake of simplicity. For example, the device 400 may further include one or more components of other devices in accordance with the disclosure.

The device 400 may include a reference voltage terminal 2, a supply voltage terminal 4 a phase terminal 6, a first semiconductor chip 16 and a second semiconductor chip 18. The components may be stacked over each other in a vertical direction (see y-axis) as illustrated in FIG. 4. Each of the first semiconductor chip 16 and the second semiconductor chip 18 may include a power transistor and a controller such that a circuitry similar to FIG. 3 may be realized in the device 400. The device 400 may further include a first electrical coupling element 20 and a second electrical coupling element 22.

For example, the reference voltage terminal 2 may be a base metal plate which may be made of copper and/or copper alloy. The reference voltage terminal 2 may be grounded and configured to dissipate operational heat produced by the semiconductor chips 16 and 18. The second semiconductor chip 18 may include a (second) power MOSFET having a vertical structure. A gate electrode and a source electrode of the second power MOSFET may be arranged on the lower surface of the second semiconductor chip 18, while a drain electrode of the second power MOSFET may be arranged on the upper surface of the second semiconductor chip 18. The source electrode of the second power MOSFET (or the anode terminal of the second semiconductor chip 18) may be electrically coupled to the reference voltage terminal 2.

The lower surface of the phase terminal 6 may be electrically coupled to the drain electrode of the second power MOSFET (or to the cathode terminal of the second semiconductor chip 18). The phase terminal 6 may be highly conductive and may e.g. be manufactured from a metal and/or a metal alloy, in particular copper and/or copper alloy. The phase terminal 6 may thus be configured to electrically and thermally couple the first semiconductor chip 16 and the second semiconductor chip 18. At least a part of the upper surface of the second semiconductor chip 18 may remain uncovered by the phase terminal 6 such that an electrical connection between the supply voltage terminal 4 and the second semiconductor chip 18 via the second electrical coupling element 22 may be established.

The first semiconductor chip 16 may include a (first) power MOSFET having a vertical structure. A gate electrode and a source electrode of the first power MOSFET may be arranged on the lower surface of the first semiconductor chip 16, while a drain electrode of the first power MOSFET may be arranged on the upper surface of the first semiconductor chip 16. The upper surface of the phase terminal 6 may be electrically coupled to the source electrode of the first power MOSFET (or to the anode terminal of the first semiconductor chip 16). At least a part of the lower surface of the first semiconductor chip 16 may remain uncovered by the phase terminal 6 such that an electrical connection between the reference voltage terminal 2 and the first semiconductor chip 16 via the first electrical coupling element 20 may be established. The lower surface of the supply voltage terminal 4 may be electrically coupled to the drain electrode of the first power MOSFET (or to the cathode terminal of the first semiconductor chip 16).

Each of the first electrical coupling element 20 and the second electrical coupling element 22 may be a pin (or a lead) manufactured from a metal and/or metal alloy, in particular copper and/or copper alloy. The first electrical coupling element 20 may provide an electrical coupling between the (first) controller integrated in the first semiconductor chip 16 and the reference voltage terminal 2. Further, the second electrical coupling element 22 may provide an electrical coupling between the (second) controller integrated in the second semiconductor chip 18 and the supply voltage terminal 4. In one example, the second electrical coupling element 22 may be laterally offset to the second semiconductor chip 18 in a direction extending out of or into the drawing plane of FIG. 4 (see z-axis) such that the second electrical coupling 22 element may bypass and thus not contact the second semiconductor chip 18 in order to reach and contact the reference voltage terminal 2. In a further example, the second electrical coupling element 22 may contact the lower surface of the second semiconductor chip 18 via a through connection extending from the upper surface of the second semiconductor chip 18 to the lower surface of the second semiconductor chip 18.

The first semiconductor chip 16 and the second semiconductor chip 18 may include similar components and may thus have similar geometric dimensions. In the example of FIG. 4, the semiconductor chips 16 and 18 may be arranged offset in a lateral direction (see x-axis) such that the electrical coupling elements 20 and 22 may substantially extend in the vertical direction (see y-axis), thereby establishing an electrical connection between the controllers in the semiconductor chips 16 and 18 and the terminals 2 and 4.

Figure 5:
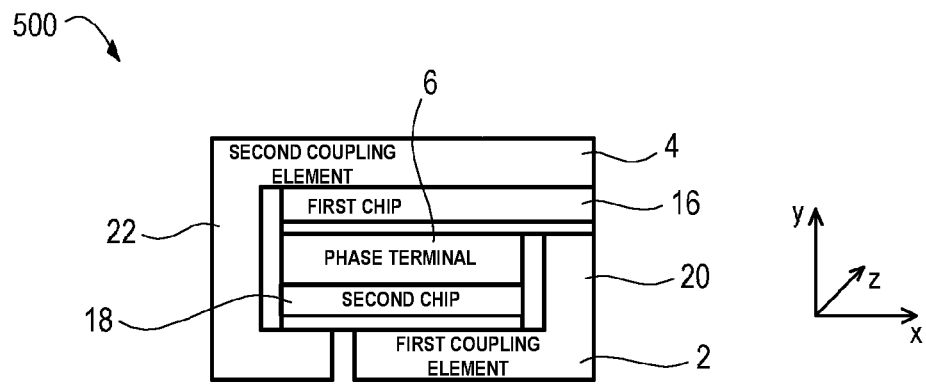
FIG. 5 schematically illustrates a cross-sectional side view of a device in accordance with the disclosure.

FIG. 5 schematically illustrates a cross-sectional side view of a device 500 in accordance with the disclosure. The device 500 may at least partly be similar to the device 400 and may include similar components such that comments made in connection with FIG. 4 may also hold true for FIG. 5. The device 500 may be configured to operate according to the circuit 300 of FIG. 3. The device 500 may include further components which are not illustrated for the sake of simplicity. For example, the device 500 may further include one or more components of other devices in accordance with the disclosure.

The electrical coupling elements 20 and 22 of the device 500 may differ from similar components of the device 400 in FIG. 4. The first electrical coupling element 20 in FIG. 5 may establish an electrical coupling between the first controller in the first semiconductor chip 16 and the reference potential terminal 2 as discussed in connection with FIG. 4, but it may differ in form and dimension. The second electrical coupling element 22 in FIG. 5 may be L-shaped including a first part extending the x-direction and a second part extending in the y-direction. The vertical first part may electrically couple to the supply voltage terminal 4, and the lateral second part may electrically couple to an electrode arranged on the lower surface of the second semiconductor chip 18, the electrode being electrically coupled to the second controller of the second semiconductor chip 18. For example, the arrangement of FIG. 5 may be used when the semiconductor chips 16 and 18 may differ in their lateral dimensions in the x-direction.

Figure 6:
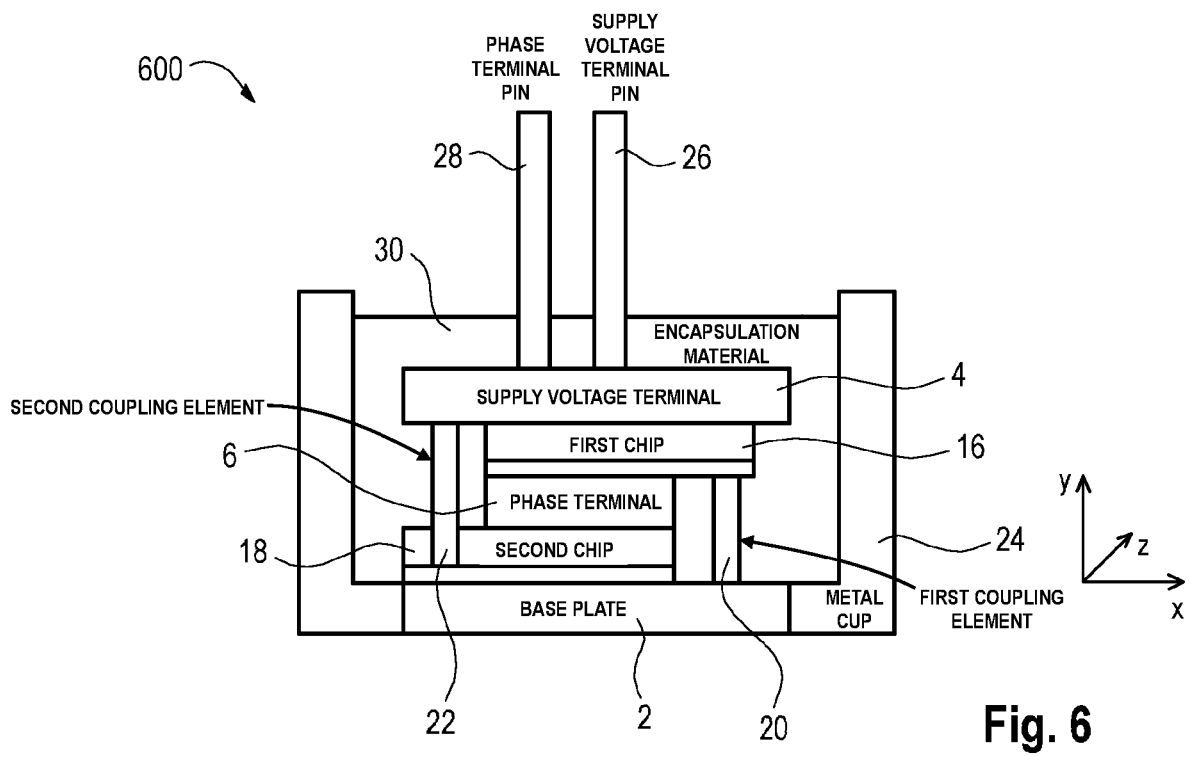
FIG. 6 schematically illustrates a cross-sectional side view of a device in accordance with the disclosure in form of a press-fit package.

FIG. 6 schematically illustrates a cross-sectional side view of a device 600 in accordance with the disclosure. The device 600 may be configured to operate according to the circuit 300 of FIG. 3 and may correspond to a press-fit package.

The device 600 may at least partly be similar to the device 400 of FIG. 4 and may include similar components. In addition, the device 600 may include a metal cup 24 forming a cavity, a supply voltage terminal pin (or lead) 26, a phase terminal pin (or lead) 28 and an encapsulation material 30. The bottom part of the metal cup 24 may include a base plate which may correspond to the reference voltage terminals 2 discussed above. The metal cup 24 may be electrically coupled to a reference potential, in particular to ground. The supply voltage pin 26 and the supply voltage terminal 4 may be formed as one piece. The supply voltage pin 26 may be electrically coupled to a supply voltage such as e.g. a battery. The phase terminal pin 28 and the phase terminal 6 may be formed as one piece. In the cross-sectional side view of FIG. 6, the connection between the phase terminal pin 28 and the phase terminal 6 may extend behind the second semiconductor chip 16 and the supply voltage terminal 4 and may thus be concealed. The cavity of the metal cup 24 may be filled with an electrically insulating encapsulation material 30 which may cover one or multiple components arranged in the cavity. In the example of FIG. 6, only the pins 26 and 28 may extend out of the encapsulation material 30.

As described above, in the example of FIG. 6, the base plate of the metal cup 24 may be electrically coupled to a reference potential, while the pin 26 may be electrically coupled to a supply voltage. It is noted that in further examples the potentials applied to the base plate of the metal cup 24 and the pin 26 may be reversed. That is, the base plate of the metal cup 24 may be electrically coupled to a supply voltage, while the pin 26 may be electrically coupled to a reference potential, in particular ground. In such case, the order of the components of the device 600 in the y-direction may be reversed in order to realize a similar circuit.

Figure 7:
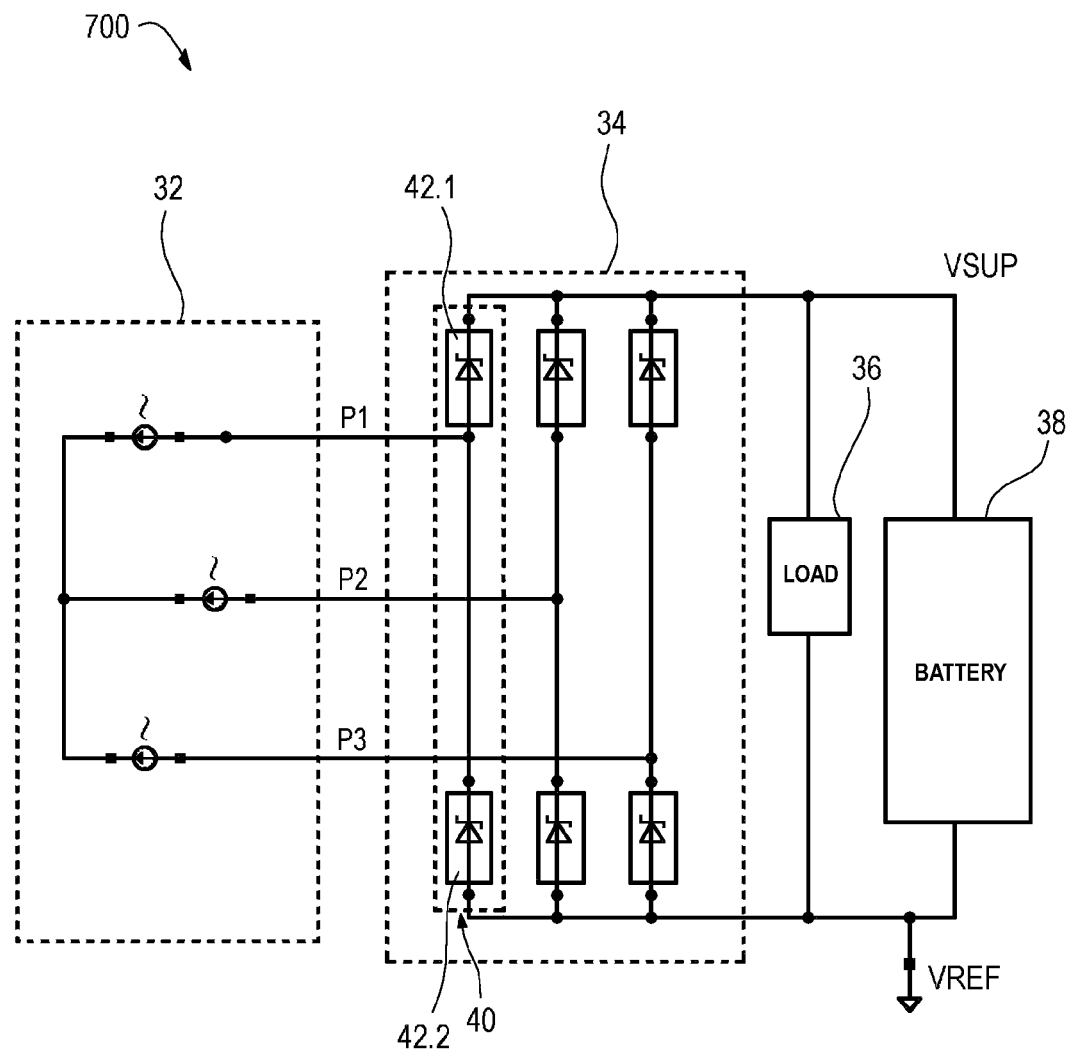
FIG. 7 illustrates a schematic diagram of a circuit including a multiphase rectifier.

FIG. 7 illustrates a schematic diagram of a circuit 700 which may be used in a vehicle. The circuit 700 may include an alternator 32, a multiphase rectifier 34, a load 36 and a battery 38. The multiphase rectifier 34 may include three branches 40, wherein each of the branches 40 may include two diodes 42.1, 42.2.

In the example of FIG. 7, the alternator 32 may be a three-phase alternator configured to generate three independent AC currents (see P1, P2, P3). The three AC currents may have a same frequency, a same amplitude and may be phase shifted with respect to each other by a value of 120°. Each of the three AC currents may be input to a respective branch 40 of the multiphase rectifier 34 which may accordingly correspond to a three-phase rectifier. The three branches 40 of the rectifier 34 may be configured to rectify the AC currents such that a DC voltage may be provided at an output of the rectifier 34. The DC voltage (see VSUP, VREF) may e.g. be used for power supplying a load 36. Also, the DC voltage may be used for charging the battery 38. It is noted that in a further example, the circuit 700 may be based on six phases. That is, the alternator 32 and the rectifier 34 may correspond to a six-phase alternator and a six-phase rectifier. In yet a further example, the circuit 700 may be based on five phases. That is, the alternator 32 and the rectifier 34 may correspond to a five-phase alternator and a five-phase rectifier.

Figure 8:
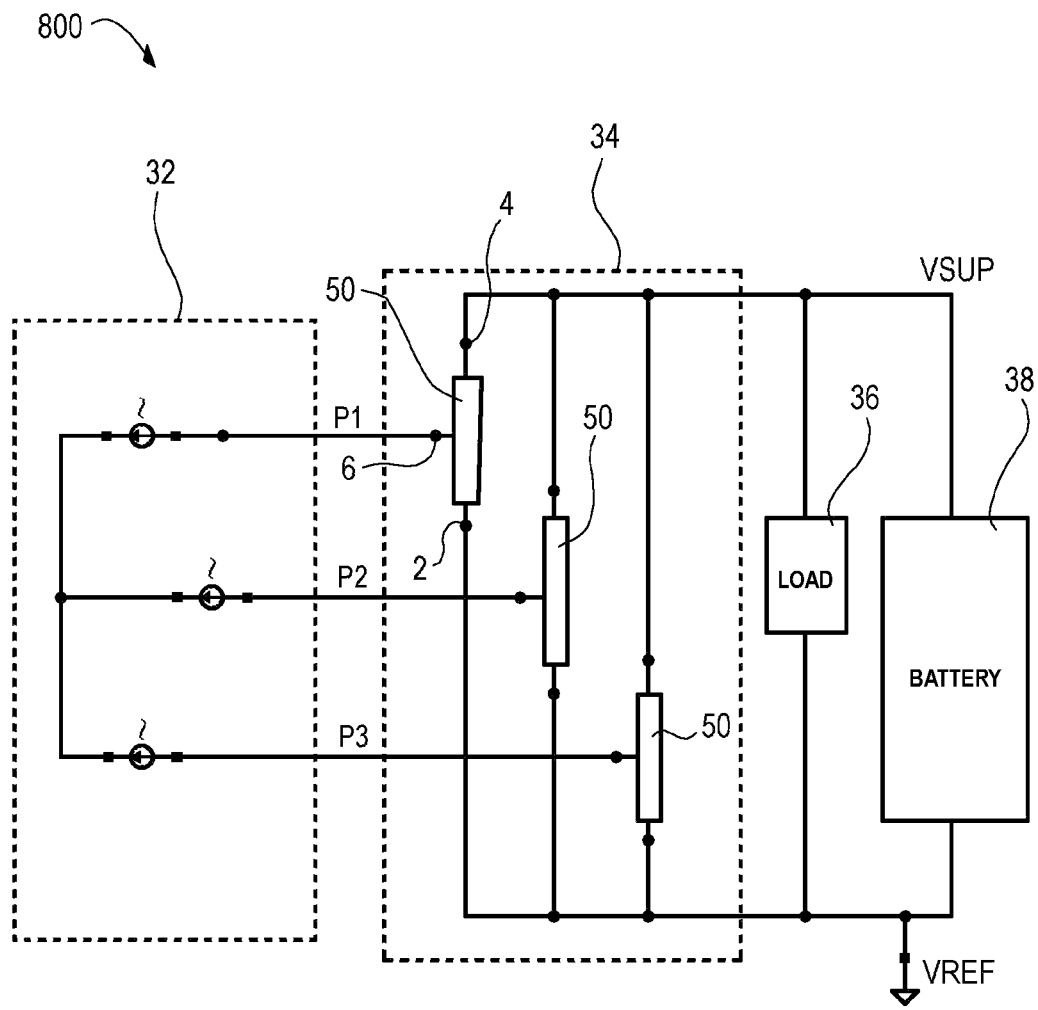
FIG. 8 illustrates a schematic diagram of a circuit including a multiphase rectifier. The multiphase rectifier includes power semiconductor packages in accordance with the disclosure.

FIG. 8 illustrates a schematic diagram of a circuit 800 including power semiconductor packages in accordance with the disclosure. The circuit 800 may operate similar to the circuit 700 of FIG. 7.

The circuit 800 may at least partly include similar components as the circuit 700. Compared to the circuit 700, in each of the branches of the three-phase rectifier 34, the respective pair of diodes 42.1, 42.2 may be replaced by a power semiconductor package 50 including terminals 2, 4 and 6 as discussed in connection with foregoing figures. The power semiconductor package 50 may be similar to any of the discussed power semiconductor packages or circuits in accordance with the disclosure.

As described in connection with FIG. 1, the circuit 800 which uses the power semiconductor packages 50 may provide a reduced voltage drop at the branches of the rectifier 34 as compared to the circuit 700 which uses diodes in the branches of the rectifier 34. In addition, as described in connection with FIG. 2, the power semiconductor packages 50 are not required to include an internal power source to supply controllers included in the power semiconductor packages. Rather, the controllers may be supplied based on the potential difference between the supply voltage VSUP and the reference potential VREF.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the term "exemplary" is merely meant as an example, rather than the best or optimal. It is also to be appreciated that features and/or elements depicted herein are illustrated with particular dimensions relative to each other for purposes of simplicity and ease of understanding and that actual dimensions may differ substantially from that illustrated herein.

Although specific aspects have been illustrated and described herein, it will be appreciated by those of ordinary skill in the art that a variety of alternate and/or equivalent implementations may be substituted for the specific aspects shown and described without departing from the concept of the disclosure. This application is intended to cover any adaptations or variations of the specific aspects discussed herein. Therefore, it is intended that this disclosure be limited only by the claims and the equivalents thereof

What is claimed is:

1. A power semiconductor package, comprising:
a reference voltage terminal;
a supply voltage terminal, wherein the supply voltage terminal and the reference voltage terminal are DC voltage output terminals of the power semiconductor package;
a phase terminal;
a first power transistor;
a second power transistor, wherein the first power transistor and the second power transistor are connected in series and form a low side switch and a high side switch of a half bridge circuit;
a first controller configured to control the first power transistor, wherein the first controller is directly connected to the reference voltage terminal; and
a second controller configured to control the second power transistor, wherein the second controller is directly connected to the supply voltage terminal, wherein each of the first controller and the second controller is configured to be power supplied based on a potential difference between a supply voltage applied to the supply voltage terminal and a reference voltage applied to the reference voltage terminal.

2. The power semiconductor package of claim 1, wherein
the supply voltage terminal is electrically coupled to a drain electrode of the first power transistor,
the reference voltage terminal is electrically coupled to a source electrode of the second power transistor, and
the phase terminal is electrically interconnected between a source electrode of the first power transistor and a drain electrode of the second power transistor.

3. The power semiconductor package of claim 1, further comprising:

the first controller configured to control a gate electrode of the first power transistor; and
the second controller configured to control a gate electrode of the second power transistor.

4. The power semiconductor package of claim 3, wherein
the first controller is interconnected between the gate electrode of the first power transistor and the reference voltage terminal, and
the second controller is interconnected between the gate electrode of the second power transistor and the supply voltage terminal.

5. The power semiconductor package of claim 3, wherein a power supply of the first controller and the second controller is independent of a package internal power source.

6. The power semiconductor package of claim 3, wherein
the first controller and the first power transistor are monolithically integrated in a first semiconductor chip, and
the second controller and the second power transistor are monolithically integrated in a second semiconductor chip.

7. The power semiconductor package of claim 6, wherein the first semiconductor chip and the second semiconductor chip are stacked over each other in a vertical direction.

8. The power semiconductor package of claim 7, wherein the first semiconductor chip and the second semiconductor chip are offset in a lateral direction.

9. The power semiconductor package of claim 8, further comprising:
a first electrical coupling element electrically coupling the reference voltage terminal and the first semiconductor chip, wherein the first electrical coupling element is arranged laterally offset to the second semiconductor chip and extends in the vertical direction; and
a second electrical coupling element electrically coupling the supply voltage terminal and the second semiconductor chip wherein the second electrical coupling element is arranged laterally offset to the first semiconductor chip and extends in the vertical direction.

10. The power semiconductor package of claim 9, wherein at least one of the first electrical coupling element and the second electrical coupling element comprises a pin.

11. The power semiconductor package of claim 1, wherein each of the supply voltage terminal and the phase terminal comprises a pin.

12. The power semiconductor package of claim 1, wherein the reference voltage terminal comprises a base plate.

13. The power semiconductor package of claim 1, wherein each of the reference voltage terminal, the supply voltage terminal and the phase terminal is accessible from outside the power semiconductor package.

14. The power semiconductor package of claim 1, wherein the power semiconductor package is a 3-terminal package.

15. The power semiconductor package of claim 1, wherein the power semiconductor package is a press-fit package.

16. The power semiconductor package of claim 1, wherein the power semiconductor package is configured to operate as a branch of a multiphase rectifier.

17. A circuit, comprising:
a supply voltage terminal;
a reference voltage terminal, wherein the supply voltage terminal and the reference voltage terminal are DC voltage output terminals of the circuit;
a first power transistor;

a second power transistor, wherein the first power transistor and the second power transistor are connected in series and form a low side switch and a high side switch of a half bridge circuit;

a first controller configured to control the first power transistor, wherein the first controller is connected to the first power transistor and directly connected to the reference voltage terminal; and a second controller configured to control the second power transistor, wherein the second controller is connected to the second power transistor and directly connected to the supply voltage terminal, wherein each of the first controller and the second controller is configured to be powered by a potential difference between a supply voltage applied to the supply voltage terminal and a reference voltage applied to the reference voltage terminal.

18. A multiphase rectifier comprising multiple branches, wherein at least one of the multiple branches comprises a semiconductor package, the semiconductor package comprising:

a reference voltage terminal;

a supply voltage terminal, wherein the supply voltage terminal and the reference voltage terminal are DC voltage output terminals of the multiphase rectifier;

a phase terminal;

a first power transistor;

a second power transistor, wherein the first power transistor and the second power transistor are connected in series and form a low side switch and a high side switch of a half bridge circuit;

a first controller connected to the first power transistor and directly connected to the reference voltage terminal; and a second controller connected to the second power transistor and directly connected to the supply voltage terminal, wherein each of the first controller and the second controller is configured to be power supplied based on a potential difference between a supply voltage applied to the supply voltage terminal and a reference voltage applied to the reference voltage terminal.

19. The multiphase rectifier of claim 18, wherein the multiphase rectifier is configured to operate in an automotive alternator.

* * * * *